United States Patent
Murayama et al.

(10) Patent No.: US 6,538,332 B2
(45) Date of Patent: Mar. 25, 2003

(54) SEMICONDUCTOR DEVICE AND METHOD OF PRODUCTION OF SAME

(75) Inventors: Kei Murayama, Nagano (JP); Mitsutoshi Higashi, Nagano (JP)

(73) Assignee: Shinko Electric Industries, Co., Ltd., Nagano (JP)

( * ) Notice: Subject to any disclaimer, the term of this patent is extended or adjusted under 35 U.S.C. 154(b) by 0 days.

(21) Appl. No.: 09/973,111

(22) Filed: Oct. 9, 2001

(65) Prior Publication Data
US 2002/0041033 A1 Apr. 11, 2002

(30) Foreign Application Priority Data
Oct. 11, 2000 (JP) .......................... 2000-310689

(51) Int. Cl.[7] .......................... H01L 29/40; H01L 23/29
(52) U.S. Cl. .................. 257/777; 257/774; 257/775; 257/792
(58) Field of Search ................ 257/777, 774, 257/775, 792, 786, 723

(56) References Cited

U.S. PATENT DOCUMENTS

| 5,821,614 | A | * | 10/1998 | Hashimoto et al. | ......... | 257/679 |
| 6,104,088 | A | * | 8/2000 | Hatano et al. | ............... | 257/698 |
| 6,353,420 | B1 | * | 3/2002 | Chung | ......................... | 257/777 |
| 6,239,496 | B1 | * | 5/2002 | Asada | ......................... | 257/777 |
| 6,407,451 | B2 | * | 6/2002 | Akram et al. | ............... | 257/698 |
| 6,281,042 | B1 | * | 8/2002 | Ahn et al. | .................. | 438/108 |
| 6,429,511 | B2 | * | 8/2002 | Rudy et al. | .................. | 257/704 |

FOREIGN PATENT DOCUMENTS

JP           A-5-82937           3/1992

* cited by examiner

*Primary Examiner*—Jasmine J B Clark
(74) *Attorney, Agent, or Firm*—Paul & Paul

(57) ABSTRACT

A semiconductor device thinner than the past and improved in reliability of electrical connection between semiconductor chips and an interconnection substrate including a polyimide film (insulating plastic film) formed with stud bump through holes, an interconnection pattern formed on one surface of the polyimide film and covering openings of the stud bump through holes at least at that one surface, a first semiconductor chip flip-chip bonded to the interconnection pattern, a second semiconductor chip flip-chip bonded to the other surface of the polyimide film so as to be electrically connected with the interconnection pattern through the stud bump through holes, and solder bumps (external connection terminals) and a method for production of the same by fewer steps than in the past.

6 Claims, 14 Drawing Sheets

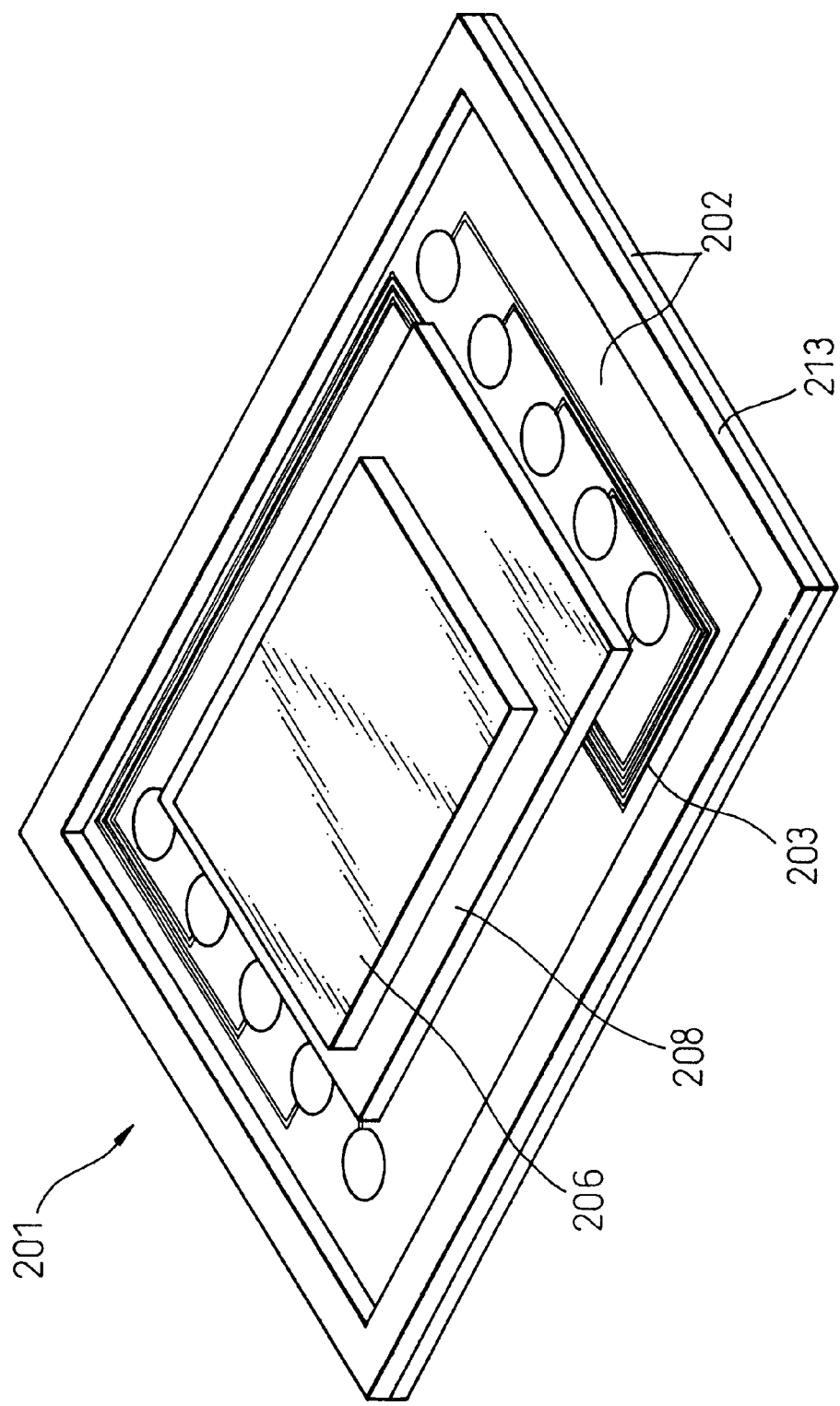

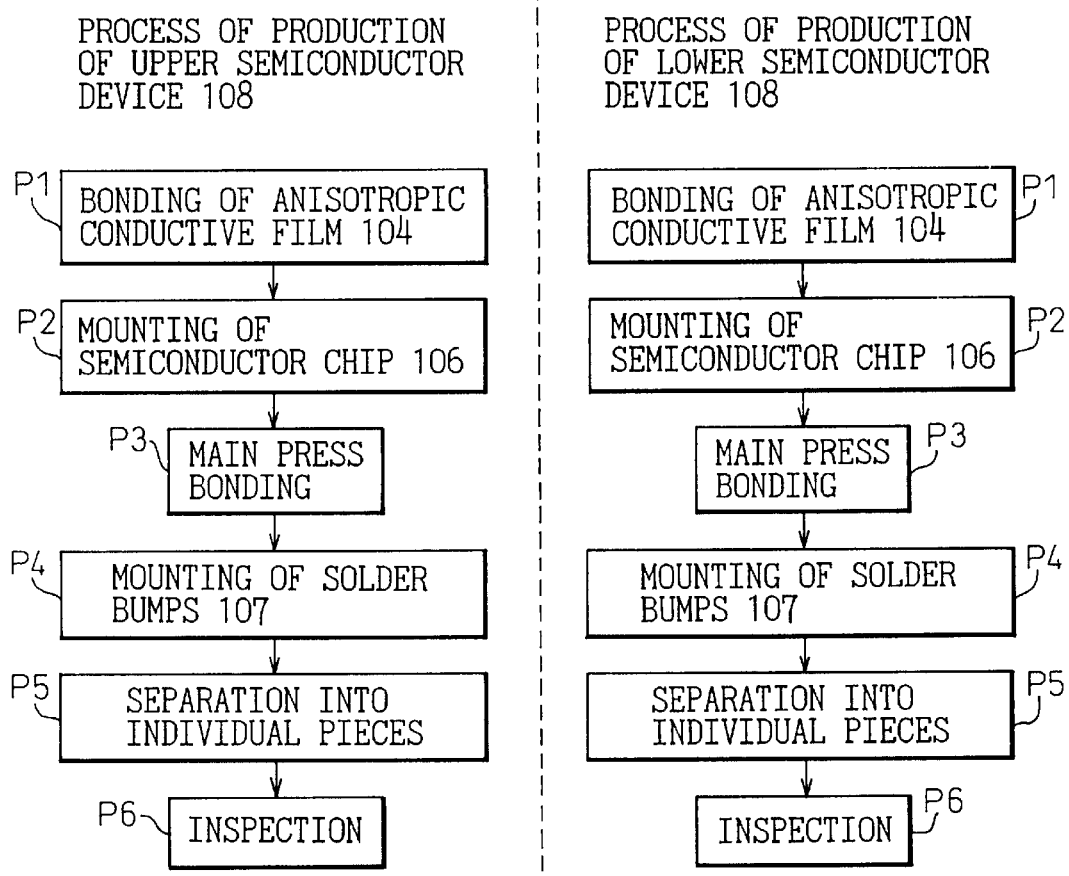

SEMICONDUCTOR DEVICE AND METHOD OF PRODUCTION OF SAME

BACKGROUND OF THE INVENTION

1. Field of the Invention

The present invention relates to a semiconductor device provided with a plurality of semiconductor chips and a method for production of the same. More particularly, it relates to a technique useful for reducing the size of a semiconductor device provided with a plurality of semiconductor chips and reducing the cost of the method of production of a semiconductor device.

2. Description of the Related Art

In recent years, the reduction in size of electronic apparatuses has led to a demand for a reduction in size of the semiconductor devices mounted in such electronic apparatuses. Giving one example, a semiconductor device provided with a plurality of semiconductor memory chips has been demanded to increase the storage capacity in a limited mounting region. Such a semiconductor device of the related art will be explained first with reference to FIG. 8. FIG. 8 is a sectional view of a semiconductor device of the related art.

The semiconductor device 101 shown in FIG. 8 is comprised of two semiconductor devices 108 each comprised of a semiconductor chip 106 flip-chip bonded to an interconnection substrate 109 stacked above and below each other. The interconnection substrate 109 is comprised of a polyimide film 102 and interconnection pattern 103. Among these, the polyimide film 102 is formed with through holes 102a, 102a, . . . . Further, 107, 107, . . . are solder bumps. These are electrically connected with the above interconnection pattern 103 through the through holes 102a, 102a, . . . . Note that the interconnection pattern 103 is comprised of copper.

Looking at the semiconductor chip 106, stud bumps 105, 105, . . . comprised of gold are formed on its electrode terminal forming surface. These stud bumps 105, 105, . . . are electrode terminals of the semiconductor chip 106 and are electrically connected with the interconnection pattern 103 through an anisotropic conductive film 104.

As illustrated, the solder bumps 107, 107, . . . of the upper semiconductor device 108 are bonded on to the interconnection pattern 103 of the lower semiconductor device 108. Due to this, the upper and lower semiconductor devices 108 are electrically and mechanically connected. Further, by reflow of the solder bumps 107, 107, . . . of the lower semiconductor device 108 in the state with the solder bumps 107, 107, . . . abutting against the mounting board 110, the semiconductor device 101 and the mounting board 110 are electrically and mechanically connected. Further, the thickness of the lower and upper semiconductor devices 108 is about 300 μm, while the overall thickness of the semiconductor device 101 is about 600 μm.

According to the semiconductor device 101, since two semiconductor chips 106 are provided in the thickness direction, it is possible to reduce the mounting area compared with when arranging two semiconductor chips 106 in one plane.

Next, an explanation will be made of the method of production of this semiconductor device 101 of the related art while referring to FIGS. 9A to 9N. FIGS. 9A to 9N are sectional views of the method of production of a semiconductor device according to the related art.

First, to produce the upper semiconductor device 108, as shown in FIG. 9A, a long polyimide film 102 on which a copper foil 111 is bonded is provided.

Next, as shown in FIG. 9B, a photoresist 112 is coated on the copper foil 111.

Next, as shown in FIG. 9C, an interconnection pattern is exposed on the photoresist 112. In the figure, 112a shows a photoresist sensitized by this exposure.

Next, as shown in FIG. 9D, the photoresist 112 is developed. Due to this, only the exposed photoresist 112a remains on the copper foil 111. The surface of the copper foil 111 at the portions not becoming interconnections is exposed.

Next, as shown in FIG. 9E, the portions of the copper foil 111 with exposed surfaces are etched. Due to this step, the parts of the copper foil 111 at the portions not becoming interconnections are removed and an interconnection pattern 103 (see FIG. 8) is formed on the polyimide film 102.

Next, as shown in FIG. 9F, the interconnection pattern 103 is made to face vertically downward and the sensitized photoresist 112a is removed.

Next, as shown in FIG. 9G, a laser beam is focused on the polyimide film 102 to form the through holes 102a, 102a, . . . (see FIG. 8). Due to the steps up to here, an interconnection substrate 109 comprised of the polyimide film 102 and the interconnection pattern 103 is completed.

Next, as shown in FIG. 9I, a film-like anisotropic conductive film 104 is bonded to the interconnection pattern 103.

Next, as shown in FIG. 9J, a semiconductor chip 106 is placed on the anisotropic conductive film 104. At this stage, the semiconductor device 106 is placed on the anisotropic conductive film by an extremely weak force. Sufficient bonding force between the semiconductor chip 106 and the interconnection substrate 109 is not yet obtained. Further, sufficient electrical connection between the stud bumps 105, 105 . . . and interconnection pattern 103 is not yet obtained either.

Next, as shown in FIG. 9K, the interconnection substrate 109 is placed on a stage 113 where a tool 114 is pressed against the semiconductor chip 106 and the anisotropic conductive film 104 is heated. Due to this, the anisotropic conductive film 104 is heated and pressed to cure, whereby a sufficient bonding force is obtained between the interconnection substrate 109 and the semiconductor chip 106. Further, due to the pressure, the portions of the anisotropic conductive film 104 sandwiched between the stud bumps 105, 105, . . . and the interconnection pattern 103 are given conductivity, whereby the semiconductor chip 106 and the interconnection substrate are electrically connected. Below, the step of heating and pressing the anisotropic conductive film in this way will be called the "main press bonding step".

When this main press bonding step is finished, the step shown in FIG. 9L is performed. In this step, solder bumps 107, 107, . . . are placed on the parts of the interconnection pattern 103 exposed from the through holes 102a, 102a . . . .

In the above figures, the portion corresponding to a single semiconductor device 108 is shown, but in practice, as shown in FIG. 9M, a plurality of semiconductor devices 108 are formed on a long polyimide film 102.

Next, as shown in FIG. 9N, the polyimide film 102 is cut to separate the plurality of semiconductor devices 108 into individual pieces.

Finally, each of the individual pieces of the semiconductor devices 108 is inspected to determine if it satisfies predetermined specifications for electrical characteristics.

Due to this, the upper semiconductor device 108 shown in FIG. 8 is completed.

The main points of the above production process may be summarized as in FIG. 10. FIG. 10 is a flow chart of the main points of the method of production of a semiconductor device of the related art.

As shown at the left in FIG. 10, the production process of the upper semiconductor device 108 is comprised of the following six steps:

Step P1: Bonding of anisotropic conductive film 104 (step of FIG. 9I)

Step P2: Mounting of semiconductor chip 106 (step of FIG. 9J)

Step P3: Main press bonding (step of FIG. 9K)

Step P4: Mounting of solder bumps 107 (step of FIG. 9L)

Step P5: Separation into individual-pieces (step of FIG. 9N)

Step P6: Inspection

Further, the lower semiconductor device 108 (see FIG. 8), as shown at the right side of FIG. 10, is produced by the same six steps as the production process of the upper semiconductor device 108. When the lower semiconductor device 108 is completed, it is stacked together with the already completed upper semiconductor device 108 to complete the semiconductor device 101 shown in FIG. 8.

Summarizing the problems to be solved by the invention, for further reduction of the size of electronic apparatuses, it is desirable that the thickness of the semiconductor device mounted in it be made as small as possible.

As shown in FIG. 8, however, in the semiconductor device 101 of the related art, two interconnection substrates 109 are provided in the thickness direction. Therefore, the thickness of the semiconductor device 101 ends up becoming greater by the amount of the thickness of the interconnection substrate 109.

Further, comparing the heat expansion coefficients of an interconnection substrate 109 comprised mainly of a polyimide plastic and a semiconductor element 106 comprised mainly of silicon, the heat expansion coefficient of the interconnection substrate 109 is far greater. Therefore, under situations where the semiconductor device 101 is heated, such as when reflowing the solder bumps 107, 107, . . . , stress occurs in the interconnection substrate 109 due to the difference in heat expansion coefficients between the interconnection substrate 109 and the semiconductor chip 106 and the interconnection substrate 109 ends up warping.

If the interconnection substrate 109 warps in this way, however, the stud bumps 105, 105 . . . end up separating from the anisotropic conductive film 104 and the reliability of electrical connection between the semiconductor chip 106 and the interconnection substrate 109 ends up falling.

On the other hand, it is desirable that the number of steps in the method of production of a semiconductor device be made as small as possible to reduce the manufacturing cost of the semiconductor device.

As shown in FIG. 10, however, in the past, each of the upper semiconductor device 108 and lower semiconductor device 108 were produced by exactly the same process, so the same process had to be performed twice to produce a single semiconductor device 101 and therefore the number of steps ended up becoming larger. Specifically, the six steps from step P1 to P6 shown in FIG. 10 had to be performed for each of the upper and lower semiconductor devices 108 and consequently a total of 12 steps (=six steps×2) ended up becoming necessary.

SUMMARY OF THE INVENTION

A first object of the present invention is to provide a semiconductor device thinner than the past and improved in reliability of electrical connection between semiconductor chips and an interconnection substrate.

A second object of the present invention is to provide a method for production of the above semiconductor device by fewer steps than in the past.

To achieve the first object, according to a first aspect of the present invention, there is provided a semiconductor device comprising an insulating plastic film formed with through holes; an interconnection pattern formed on one surface of said plastic film and covering openings of said through holes at least at said one surface; a first semiconductor chip flip-chip bonded on said interconnection pattern so as to be electrically connected with said interconnection pattern; a second semiconductor chip flip-chip bonded on the other surface of said plastic film so as to be electrically connected with said interconnection pattern through said through holes; and external connection terminals electrically connected with said interconnection pattern.

Preferably, said first semiconductor chip and said second semiconductor chip are arranged shifted from each other so that they do not completely overlap.

More preferably, a stress-cancellation plate is affixed at the region where the first semiconductor chip and the second semiconductor chip do not overlap on either surface of said plastic film.

Preferably, a first semiconductor chip and second semiconductor having the same functions and same electrode terminal array are used.

Preferably, a reinforcement plate is affixed to an edge region of one of the surfaces of said plastic film.

To achieve the second object, according to a second aspect of the present invention, there is provided a method of production of a semiconductor device comprising the steps of forming an interconnection pattern on one surface of an insulating plastic film; forming in said plastic film through holes having openings covered by said interconnection pattern; forming a first anisotropic conductive film on said interconnection pattern; forming a second anisotropic conductive film on the other surface of the plastic film and inside said through holes after forming said interconnection pattern; preliminarily press bonding one surface of a first semiconductor chip provided with projecting electrode terminals on said first anisotropic conductive film; preliminarily press bonding one surface of a second semiconductor chip provided with projecting electrode terminals on said second anisotropic conductive film so that said electrode terminals are inserted in said through holes through said second anisotropic conductive film; and simultaneously pressing the other surfaces of the first semiconductor chip and said second semiconductor chip in a state with said first anisotropic conductive film and said second anisotropic conductive film heated so as to electrically connect the electrode terminals of the first semiconductor chip and second semiconductor chip and said interconnection pattern for main press bonding.

According to the semiconductor device of the present invention, provision is made of an insulating plastic film formed with through holes. On one surface of the plastic film is formed an interconnection pattern covering the openings at least at that one surface. Further, a first semiconductor chip is flip-chip bonded on the interconnection pattern so as to be electrically connected with the interconnection pattern.

On the other hand, a second semiconductor chip is flip-chip bonded to the other surface of the plastic film so as to be electrically connected with the interconnection pattern through the through holes. The outside connection terminals are electrically connected with the interconnection pattern. By this structure, the interconnection substrate is comprised by the plastic film and interconnection pattern, but only one interconnection substrate is provided in the thickness direction of the semiconductor device. Therefore, compared with the conventional example where two interconnection substrates are provided in the thickness direction of the semiconductor device, the thickness of the semiconductor device can be made smaller.

Further, in the above structure, since the first semiconductor chip and the second semiconductor chip are provided at both surfaces of the plastic film, the stresses occurring at the two surfaces of the plastic film due to the difference in heat expansion coefficients of the plastic film and semiconductor chips are canceled out. Therefore, even under conditions where the semiconductor device is heated, since the interconnection substrate does not warp as in the past, the reliability of electrical connection between the semiconductor chips and the interconnection substrate is improved.

Note that the first semiconductor chip and the second semiconductor chip may be arranged shifted from each other so as not to completely overlap. If this is done, the portions of the interconnection pattern electrically connected with the first semiconductor chip and the portions electrically connected with the second semiconductor chip are arranged separated from each other, so these portions will no longer short-circuit.

Further, when the first semiconductor chip and the second semiconductor chip are arranged shifted from each other in this way, a stress-cancellation plate may be provided. This stress-cancellation plate is affixed on one surface of the plastic film in a region where the first semiconductor chip and second semiconductor chip do not overlap. Since the two semiconductor chips do not overlap in that region, the stresses acting from the semiconductor chips to the plastic film remain without being canceled out. Therefore, if a stress-cancellation plate is affixed in that region, the stress acting from the stress-cancellation plate to the plastic film and the stresses remaining without being canceled out are canceled out and warping of the interconnection substrate in that region is suppressed.

Further, if a first semiconductor chip and a second semiconductor chip having the same functions and same electrode terminal array are used. The design of the interconnection pattern is simplified. This is because if semiconductor chips having the same electrode terminal array are used, there is an axis of symmetry on the plastic film and the same electrode terminals of the two semiconductor chips become positioned line symmetrically with respect to that axis, so it becomes possible to connect the same electrodes linearly. Note that the ability to connect the same electrode terminals in this way is due to the use of two semiconductor chips with the same functions.

Further, it is possible to affix a reinforcement plate to the edge region of one surface of the plastic film. Due to this reinforcement plate, the strength of the semiconductor device is raised.

Further, the method of production of the semiconductor device according to the present invention includes a main press bonding step where the first semiconductor chip and the second semiconductor chip are electrically connected simultaneously to the interconnection pattern. By simultaneously electrically connecting the two semiconductor chips to the interconnection pattern in this way, the number of steps of the process of production of the semiconductor device is reduced, so the manufacturing cost of the semiconductor device is lowered.

BRIEF DESCRIPTION OF THE DRAWINGS

These and other objects and features of the present invention will become clearer from the following description of the preferred embodiments given with reference to the attached drawings, wherein:

FIG. 4 is a perspective view of a semiconductor device according to an embodiment of the present invention in the case of provision of a reinforcement plate;

FIG. 10 is a flow chart of important points of the method of production of a semiconductor device of the related art.

DESCRIPTION OF THE PREFERRED EMBODIMENTS

Preferred embodiments of the present invention will be described in detail below while referring to the attached figures.

First, an explanation will be made of a semiconductor device of one embodiment of the present invention with reference to FIG. 1 to FIG. 4.

Figure 1:
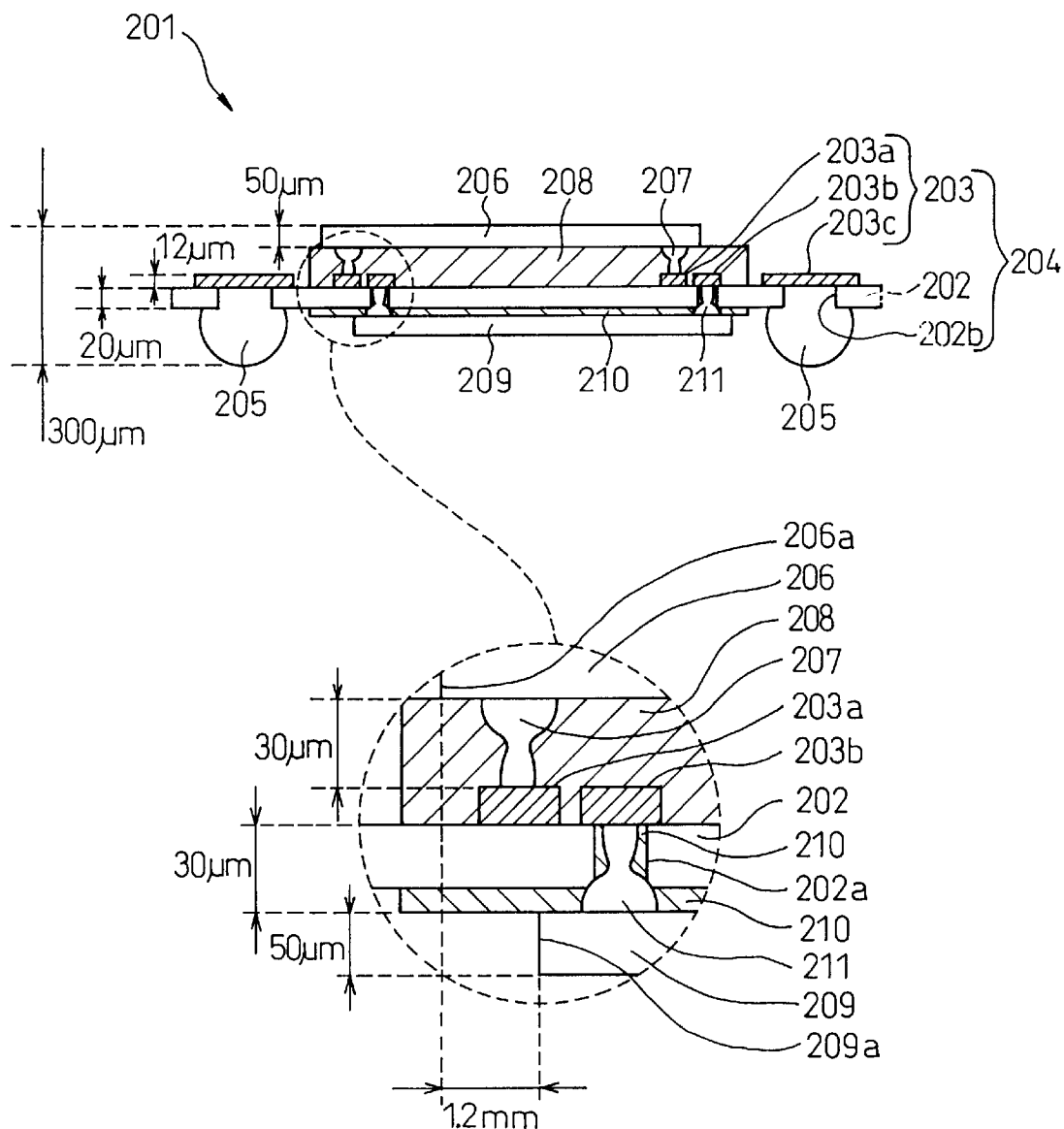
FIG. 1 is a sectional view of a semiconductor chip according to an embodiment of the present invention.

FIG. 1 is a sectional view of a semiconductor device according to the present invention. As shown in FIG. 1, the semiconductor device 201 of the present invention is provided with a polyimide film 202 (insulating plastic film) of a thickness of about 20 $\mu$m. This polyimide film 202 is formed on one surface with an interconnection pattern 203 comprised of copper and having a thickness of about 12 $\mu$m. Further, it is formed with solder bump through holes 202b, 202b, . . . . The polyimide film 202 and interconnection pattern 203 form the interconnection substrate 204.

Note that instead of the polyimide film 202, it is also possible to use a glass epoxy resin or ceramic or other rigid substrate, but from the viewpoint of reduction of the thickness of the semiconductor device 201, use of a polyimide film 202 such as in this embodiment is preferable.

Further, solder bumps 205, 205, . . . (outer connection terminals) are bonded to the other surface of the polyimide film 202. These solder bumps 205, 205, . . . are electrically connected to the solder bump electrode pads 203c through the above solder bump through holes 202b. By reflowing these solder bumps 205, 205, . . . in the state with the solder bumps 205, 205, . . . abutting against a mounting board (not shown), the semiconductor device 201 is electrically and mechanically connected to the mounting board.

Further, as illustrated, a first semiconductor chip 206 and a second semiconductor chip 209 are flip-chip bonded to the two surfaces of the interconnection substrate 204. The first semiconductor chip 206 and second semiconductor chip 209 are both about 50 µm thick.

Here, look inside the broken line circle of FIG. 1 to see the connection of the first semiconductor chip 206. As shown there, the first semiconductor chip 206 is provided with stud bumps (projecting electrode terminals) 207 made of gold on its electrode terminal forming surface. The stud bumps 206 are about 30 µm high. Further, 203a shows a first semiconductor chip electrode pad. These pads are formed on the interconnection pattern 203 at positions corresponding to the stud bumps 207.

Further, a first anisotropic conductive film 208 is formed between the first semiconductor chip 206 and the interconnection substrate 204. The first anisotropic conductive film 208 is given conductivity in the thickness direction only at portions sandwiched between the tips of the stud bumps 207 and the first semiconductor chip electrode pads 203a. Further, the stud bumps 207 and the first semiconductor chip electrode pads 203a are electrically connected through the portions given conductivity. In this way, the first semiconductor chip 206 and the interconnection pattern 203 are electrically connected through the first anisotropic conductive film 208.

Next, referring to the broken line circle in FIG. 1, take note of the connection of the second semiconductor chip 209. The second semiconductor chip 209 is provided with stud bumps (projecting electrode terminals) 211 made of gold at its electrode terminal forming surface. The stud bumps 211 are about 30 µm high. Stud bump through holes 202a are formed at positions of the polyimide film 202 corresponding to the stud bumps 211.

As explained above, an interconnection pattern 203 is formed on one surface of the polyimide film 202, but the interconnection pattern 203 is further formed with second semiconductor chip electrode pads 203b. As illustrated, the second semiconductor chip electrode pads 203b are formed to cover the openings of the stud bump through holes 202a. In other words, the interconnection pattern 203 is formed to cover the openings of the stud bump through holes 202a.

The stud bump through holes 202a are filled inside them with a second anisotropic conductive film 210 and have stud bumps 211 inserted in them. The second anisotropic conductive film 210 is given conductivity in the thickness direction only at portions sandwiched between the tips of the stud bumps 211 and the second semiconductor chip electrode pads 203b. The stud bumps 211 and the second anisotropic conductive film 210 are electrically connected by these portions given conductivity. In this way, the second semiconductor chip 209 and the interconnection pattern 203 are electrically connected through the stud bump through holes 202a.

According to the semiconductor device 201 comprised in this way, since two semiconductor chips (first semiconductor chip 206 and second semiconductor chip 209) provided in the thickness direction, it is possible to reduce the mounting area compared with the case of arranging two semiconductor chips in the same plane.

Figure 8:
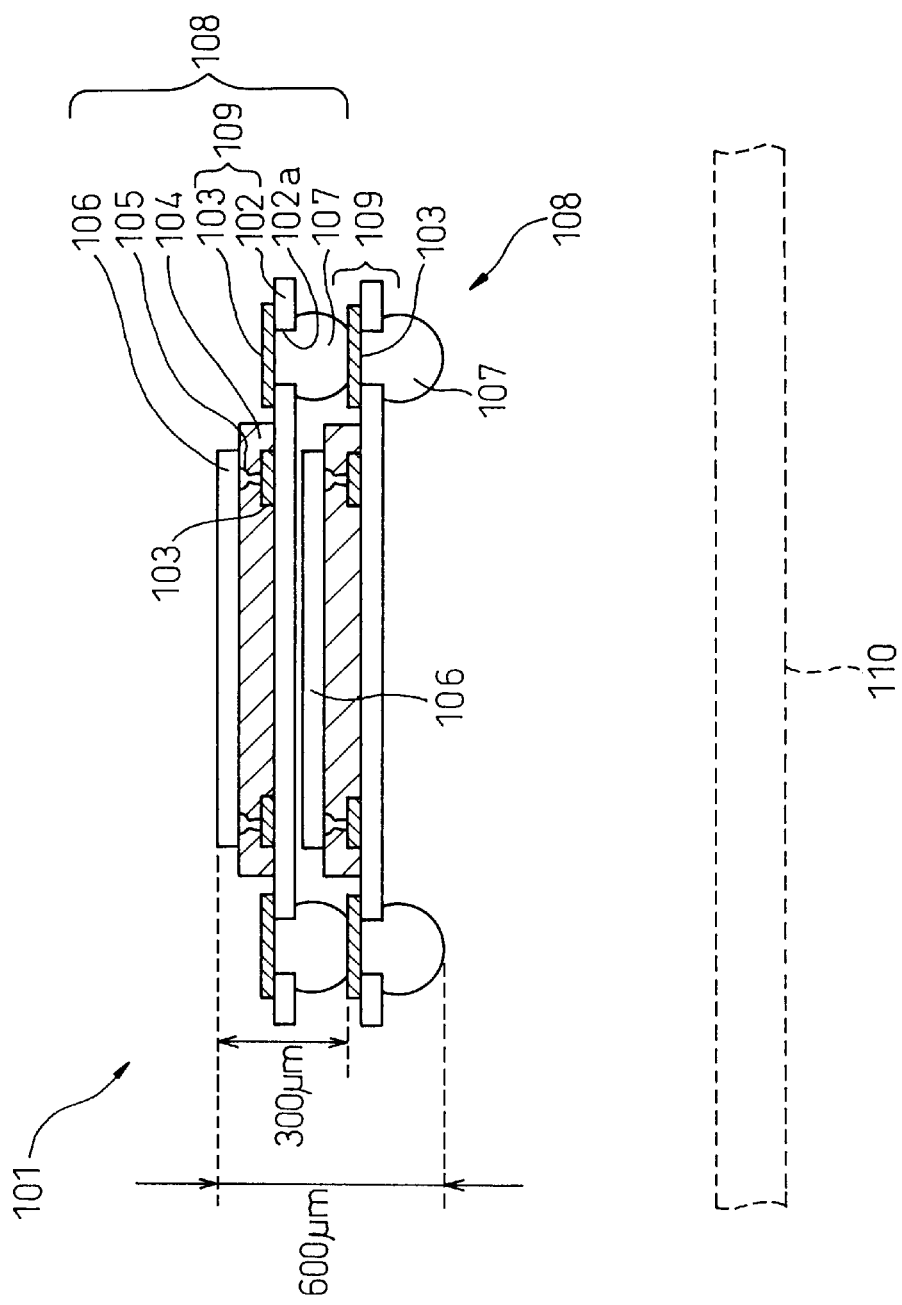
FIG. 8 is a sectional view of a semiconductor device of the related art.
Figure 9A:
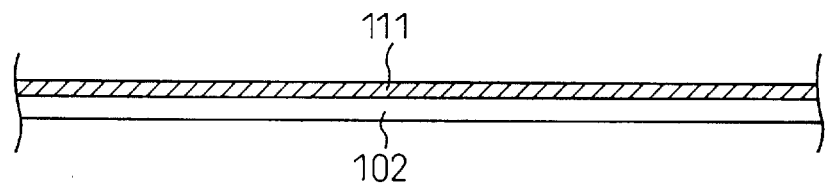
FIGS. 9A to 9N are sectional views of the method of production of a semiconductor device of the related art.
Figure 9B:
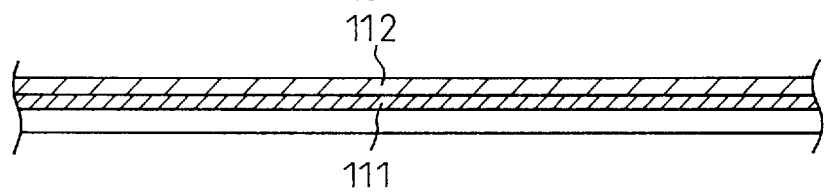
Figure 9C:
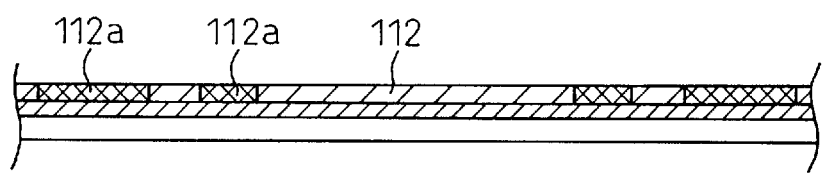
Figure 9D:
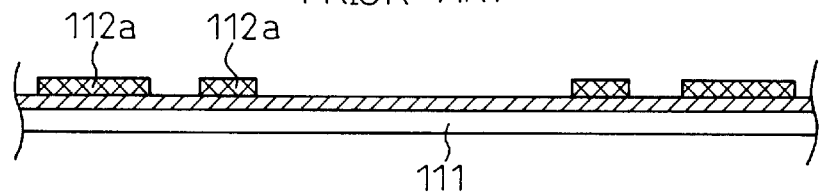
Figure 9E:
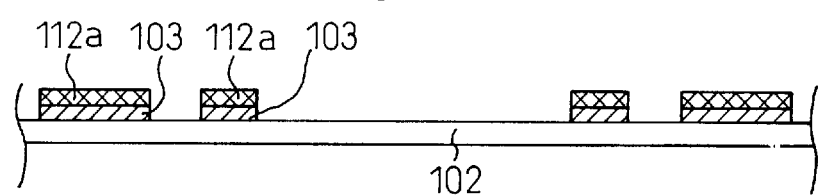
Figure 9F:
Figure 9G:
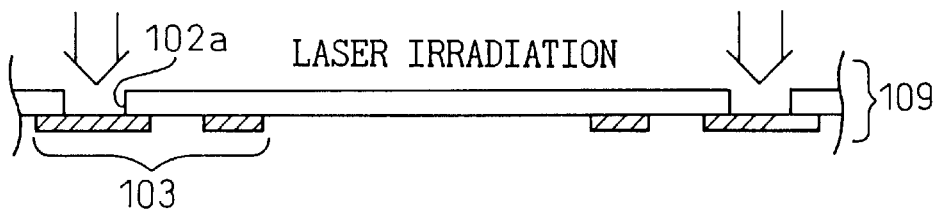
Figure 9H:
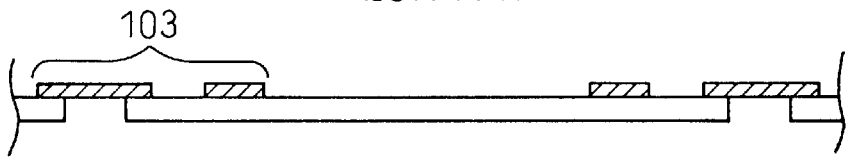
Figure 9I:
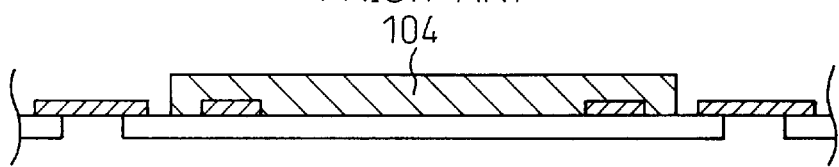
Figure 9J:
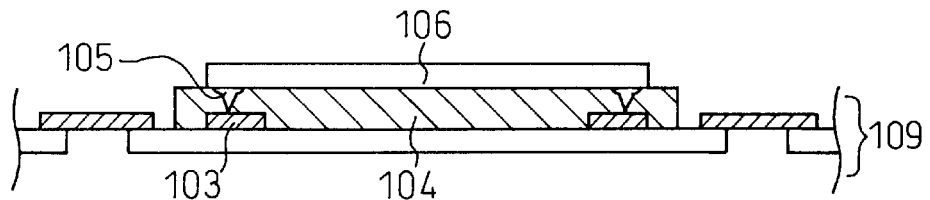
Figure 9K:
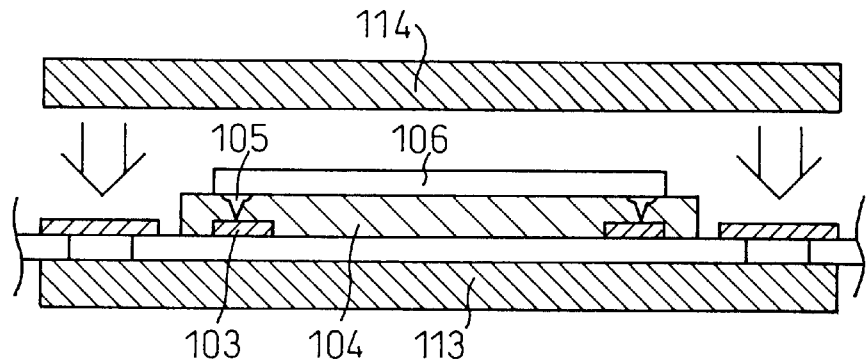
Figure 9L:
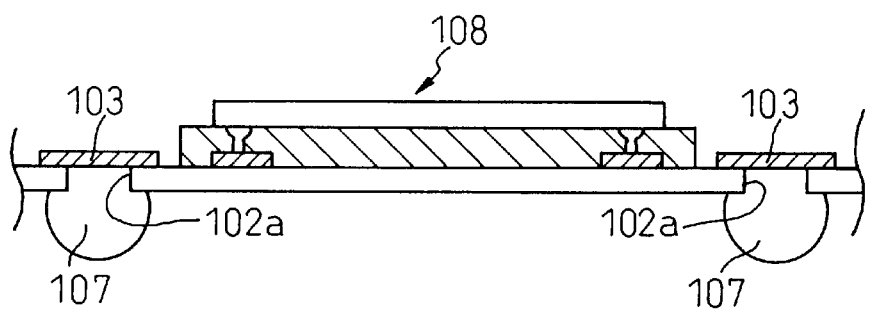
Figure 9M:
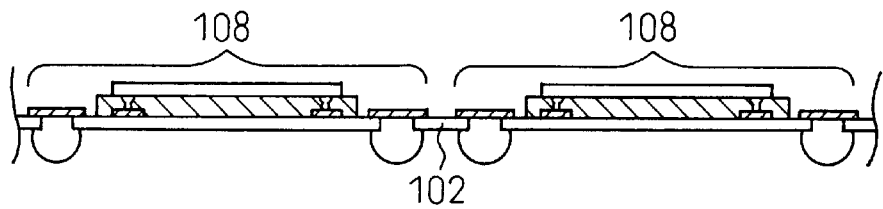
Figure 9N:
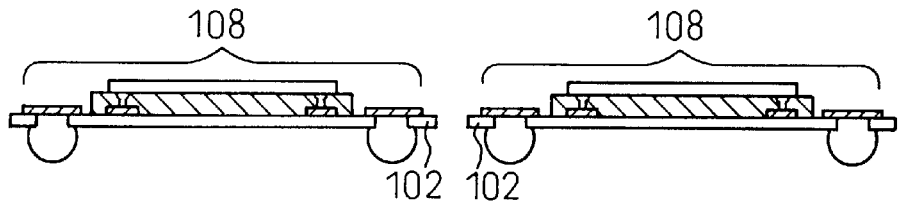

In addition, since the semiconductor device 201 is provided with only one interconnection substrate 204 in the thickness direction, it is possible to reduce the thickness compared with the example of the related art (see FIG. 8) where two interconnection substrates are provided in the thickness direction. Specifically, the thickness of the semiconductor device 201 is about 300 µm. This is a value far smaller than the thickness of the semiconductor device 101 of the example of the related art (about 600 µm). This contributes greatly to the reduction of size of electronic apparatuses recently being sought.

Further, as explained in the section on the related art, since the heat expansion coefficients of polyimide and silicon greatly differ, in the related art, the interconnection substrate 109 (see FIG. 8) had warped under conditions where the semiconductor device 108 (see FIG. 8) was heated.

As opposed to this, according to the structure of the semiconductor device 201, the first semiconductor chip 206 and the second semiconductor chip 209 are provided at the two surfaces of the polyimide film 202. Therefore, the stress acting on one surface of the polyimide film 202 from the first semiconductor chip 206 (surface formed with interconnection pattern 203) and the stress acting on the other surface of the polyimide film from the second semiconductor chip 209 cancel each other out.

Therefore, even under conditions where the semiconductor device 201 is heated such as when reflowing the solder bumps 205, 205, . . . , the interconnection substrate 204 does not warp due to stress as in the related art. Due to this, the stud bumps (207, 211) no longer separate from the anisotropic conductive films (208, 210) and the reliability of electrical connection between the interconnection pattern 203 and the semiconductor chips (206 and 209) can be improved.

Further, as shown in FIG. 1, the first semiconductor chip 206 and the second semiconductor chip 209 are arranged so as not to completely overlap when viewed from the thickness direction. By arranging them in this way, the first semiconductor chip electrode pads 203a and the second semiconductor chip electrode pads 203b can be arranged away from each other so that they do not short-circuit. To enable this, in this embodiment, the side walls 206a of the first semiconductor chip 206 and the side walls 209a of the second semiconductor chip 209 are shifted about 1.2 mm in the left-right direction of the sheet of paper.

Note that when arranging the first semiconductor chip 206 and the second semiconductor chip 209 shifted in this way, stress acting on the polyimide film 202 can be considered to remain without being canceled out in the region where the semiconductor chips are shifted and do not overlap. This is because in this region, a semiconductor chip is only affixed at one surface of the polyimide film 202, so there is no stress which would cancel out the stress acting on the other surface from the other semiconductor chip.

Figure 2:
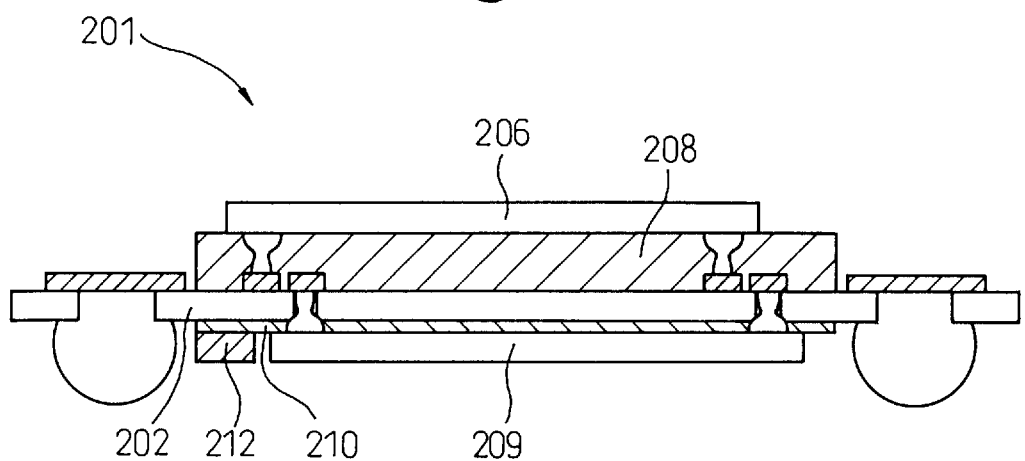
FIG. 2 is a sectional view of a semiconductor chip according to an embodiment of the present invention in the case of provision of a stress-cancellation plate.

When concerned about this point, use may be made of a dummy chip 212 (stress-cancellation plate) 212 such as shown in FIG. 2. This dummy chip 212 is affixed via the second anisotropic conductive film 210 on the surface of the polyimide film 202 not formed with the interconnection pattern 203. Further, as illustrated, the region where the dummy chip 212 is affixed is the region where the first semiconductor chip 206 and second semiconductor chip 209 are shifted from each other and the region where the stress acting on the polyimide film 202 from the first semiconductor chip 206 remains without being canceled out.

If the dummy chip 212 is arranged in this region, the stress acting on the polyimide film 202 from this dummy chip and the stress remaining without being canceled out in that region can cancel each other out.

Due to this, even if arranging the first semiconductor chip 206 and second semiconductor chip 209 shifted from each other, the stresses remaining on the polyimide film 202 along with this are canceled out and warping of the semiconductor device 201 can be suppressed.

Note that as the dummy chip 212, a silicon chip etc. not formed with a circuit is used. Further, in FIG. 2, the dummy chip 212 is affixed on the surface of the polyimide film 202 not formed with the interconnection pattern 203, but a similar action and effect can be obtained even if affixing the dummy chip 212 to the surface formed with the interconnection pattern 203.

Figure 3:
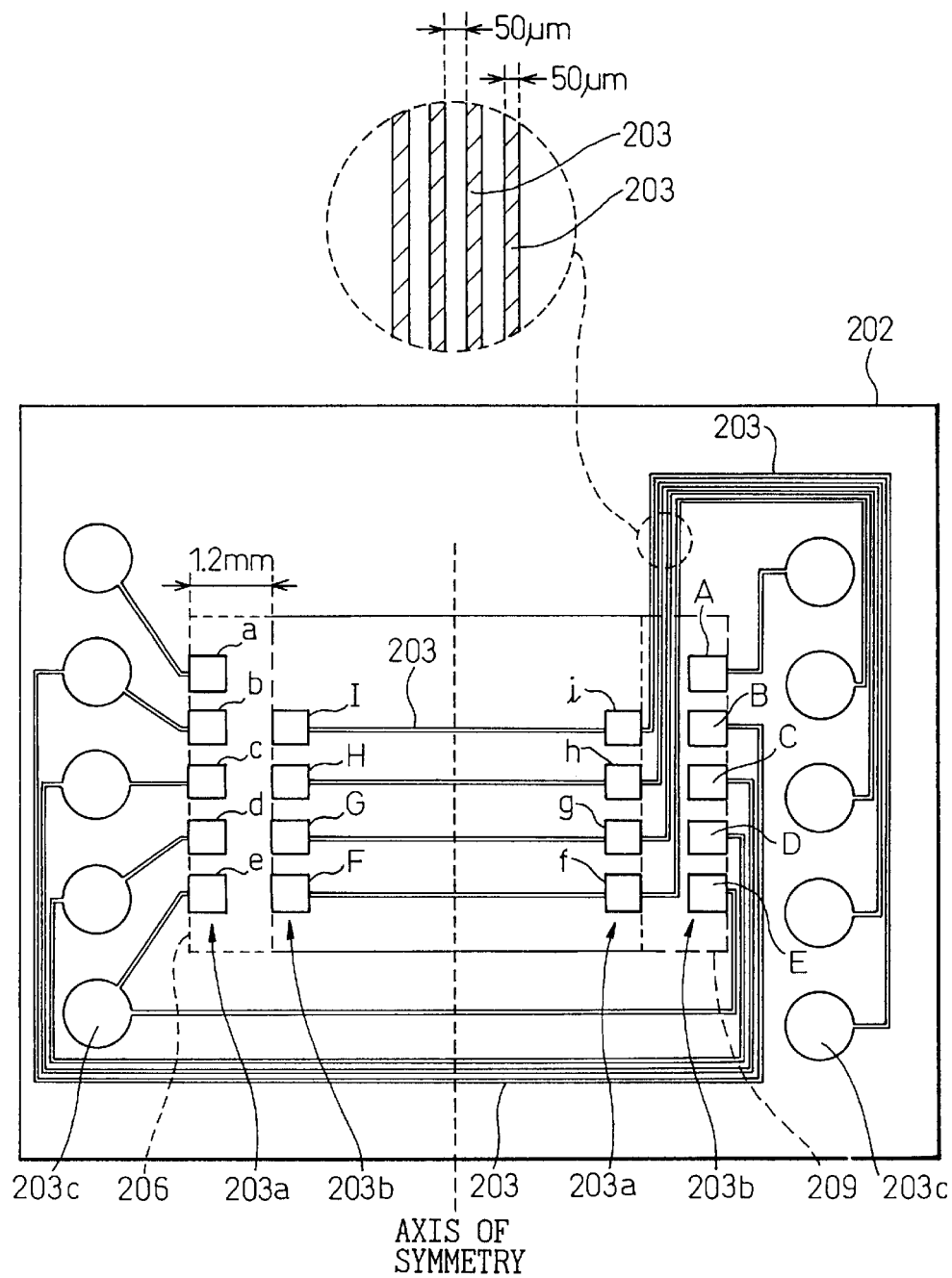
FIG. 3 is a plane view of an interconnection pattern of a semiconductor device according to an embodiment of the present invention.

If a first semiconductor chip 206 and second semiconductor chip 209 having the same functions and same electrode terminal (stud bump) array are used, the design of the interconnection pattern 203 can be simplified. This will be explained with reference to FIG. 3. FIG. 3 is a plan view of the polyimide film 202 and the interconnection pattern 203 formed on it as seen from the first semiconductor chip 206 side.

In FIG. 3, the small letters a, b, c, d, e, f, g, h, and i indicate the first semiconductor chip electrode pads 203a. The capital letters A, B, C, D, E, F, G, H, and I indicate the second semiconductor chip electrode pads 203b.

As explained above, since the first semiconductor chip 206 and the second semiconductor chip 209 have the same electrode terminal arrays, the same stud bumps (see 207 and 211 of FIG. 1) of the two semiconductor chips (206 and 209) are electrically connected to electrode pads shown by the same letters of the alphabet (a and A, b and B, . . . , h and H). Further, since the two semiconductor chips (206 and 209) have the same functions, the electrode pads shown by the same letters of the alphabet (a and A, b and B, . . . , h and H) are electrically connected by the interconnection pattern 203 and can be led out from common solder bumps 205 (see FIG. 1).

In particular, taking note of the group of pads shown by the symbols F, G, H, and I and the group of pads shown by the symbols f, g, h, and i, these are electrically connected by a linear simple interconnection pattern 203. It is possible to make the interconnection pattern 203 linear in this way since the two groups of pads are line symmetrical about the line of symmetry in the figure. Note that this line of symmetry exists due to the use of two semiconductor chips (206 and 209) having the same electrode terminal array.

In this way, if two semiconductor chips (206 and 209) having the same functions and same electrode terminal arrays are used, the design of the interconnection pattern 203 can be simplified.

Note that what is shown in the broken line circle in FIG. 3 is an enlarged view of the interconnection pattern 203. As shown here, in this embodiment, the interconnection width is about 50 μm and the interconnection pitch is also 50 μm.

Further, as shown in FIG. 4, to raise the strength of the semiconductor device 201, it is possible to affix a reinforcement plate 213 at the edge region of the surface of the polyimide film 202. FIG. 4 is a perspective view of the semiconductor device 201 in the case where a reinforcement plate 213 is affixed.

In FIG. 4, the reinforcement plate 213 is affixed to the surface of the polyimide film 202 at the first semiconductor chip 206 side, but the strength of the semiconductor device 201 can be raised even if affixing the reinforcement plate 213 to the surface of the second semiconductor chip 209 side (see FIG. 1). Further, as the reinforcement plate 213, for example, a stainless steel plate, copper plate, carbon fiber reinforced plastic (CFRP) plate, etc. is used. These are bonded to the polyimide film 202 by an adhesive (not shown).

Note that in this embodiment, the semiconductor chips (206 and 209) are flip-chip bonded to the interconnection substrate 204 through anisotropic conductive films (208 and 210), but the flip-chip bonding of the present invention is not limited to this. For example, the same action and effect can be obtained even with flip-chip bonding using controlled collapse bonding connection (CCB), epoxy solder encapsulated connection (ESC), stud bump bonding (SBB), bump interconnection technology (BIT), etc.

Next, an explanation will be made of the method of production of this semiconductor device 201 while referring to FIGS. 5A to 5N, FIGS. 6A to 6B, and FIG. 7. FIGS. 5A to 5N and FIGS. 6A to 6B are sectional views of the method of production of a semiconductor device according to this embodiment. Further, FIG. 7 is a flow chart of main points of the method of production of a semiconductor device according to this embodiment.

Figure 5A:
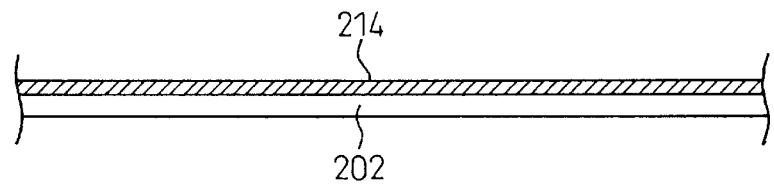
FIGS. 5A to 5N are sectional views of steps in the method of production of a semiconductor device of the present invention.

First, as shown in FIG. 5A, a long polyimide film 202 (insulating plastic film) on one surface of which a copper foil 214 is bonded is provided. As explained later, the copper film 214 is later patterned to form the interconnection pattern 203 (see FIG. 1). The thickness of the polyimide film 202 is 20 μm, while the thickness of the copper foil 214 is 12 μm.

Figure 5B:
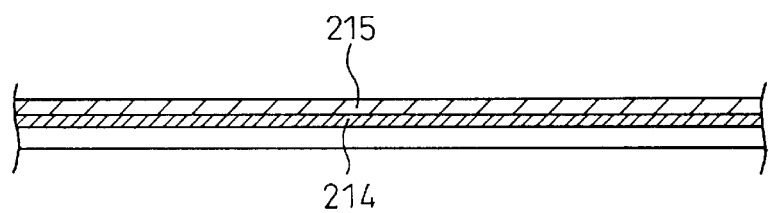

Next, as shown in FIG. 5B, a photoresist 215 is coated on the copper foil 214.

Figure 5C:
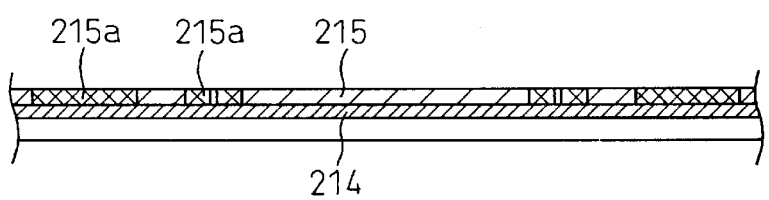

Next, as shown in FIG. 5C, an interconnection pattern is exposed on the photoresist 215. In the figure, 215a shows a photoresist sensitized by this exposure. The pattern is similar to the interconnection pattern 203 (see FIG. 1).

Figure 5D:
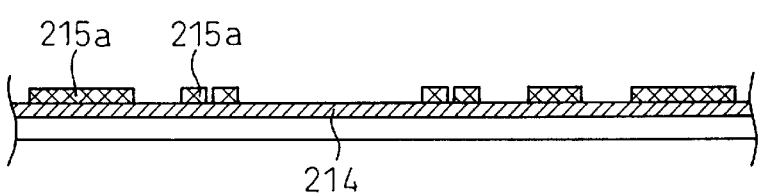

Next, as shown in FIG. 5D, the photoresist 215 is developed. Due to this development, the portions of the photoresist 215 not sensitized by the exposure are removed. Due to this, only the sensitized parts of the photoresist 215a remain on the copper foil 214. The surface of the copper foil 111 at the portions not becoming interconnections is exposed.

Figure 5E:
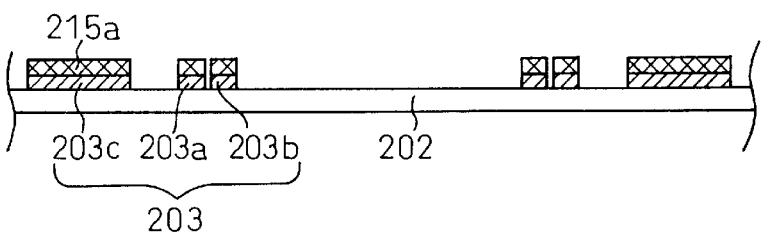

Next, as shown in FIG. 5E, the copper foil 214 is wet etched using the sensitized photoresist 215a as a mask. Due to this wet etching, an interconnection pattern 203 comprised of first semiconductor chip electrode pads 203a, second semiconductor chip electrode pads 203b, solder bump electrode pads 203c, etc. is formed on one surface of the polyimide film 202.

Figure 5F:
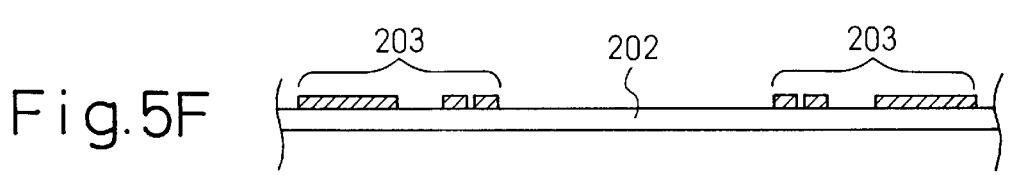

Next, as shown in FIG. 5F, the sensitized photoresist 215a is removed.

Figure 5G:
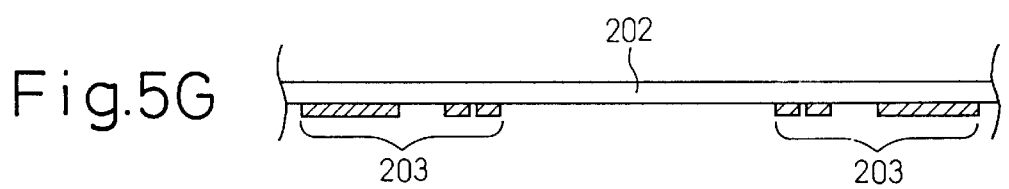

Next, as shown in FIG. 5G, the surface of the polyimide film 202 formed with the interconnection pattern 203 is made to face vertically downward.

Figure 5H:
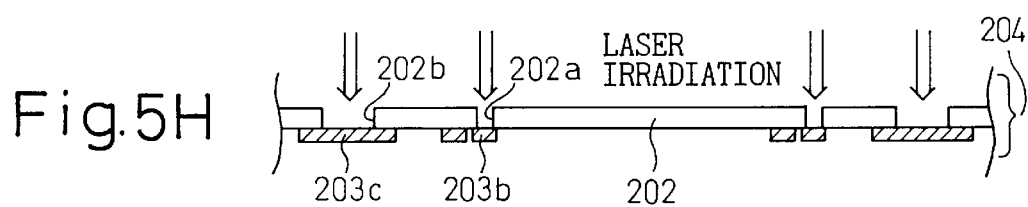

Next, as shown in FIG. 5H, a laser beam is focused on the polyimide film 202 to form the solder bump through holes 202b, 202b, . . . and stud bump through holes 202a, 202a, . . . . As the laser beam used at this time, there is for example an excimer laser, YAG laser, CO₂ laser, etc.

As illustrated, the openings of the stud bump through holes 202a, 202a, . . . are covered by parts of the interconnection pattern 203, that is, the second semiconductor chip electrode pads 203b. Due to the steps up to here, the interconnection substrate 204 is fabricated.

Figure 5I:
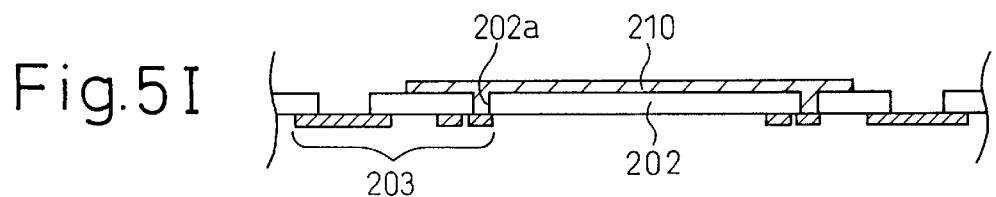

Next, as shown in FIG. 5I, a film-like second anisotropic conductive film 210 is bonded to the surface of the polyimide film 202 where the interconnection pattern 203 is not formed among the two surfaces. By this bonding, the second anisotropic conductive film 210 is formed not only on the surface of the polyimide film 202, but also inside the stud bump through holes 202a, 202a, . . . .

Figure 5J:
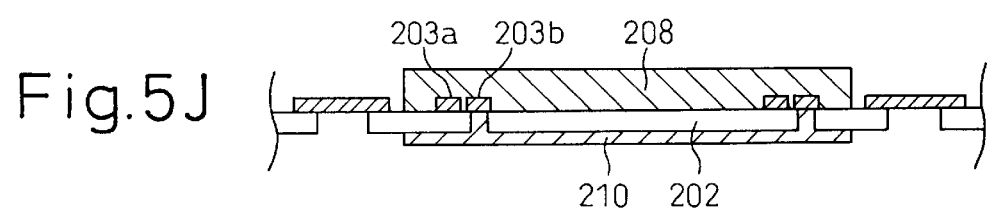

Next, as shown in FIG. 5J, the surface of the polyimide film 202 formed with the interconnection pattern 203 among the two surfaces is made to face perpendicularly downward. A first anisotropic conductive film 208 is formed by bonding a film-like anisotropic conductive film on this interconnection pattern 203.

Figure 5K:
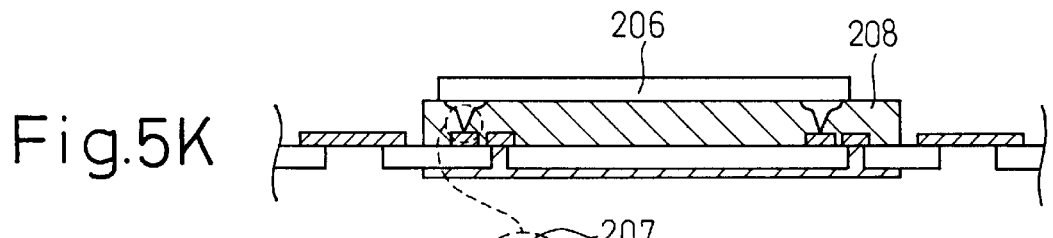

Next, as shown in FIG. 5K, the electrode terminal forming surface of the first semiconductor chip 206 is preliminarily press bonded on to the first anisotropic conductive film 208. Here, this "preliminary press bonding" means press bonding to an extent where even if the first semiconductor chip 206 is made to face perpendicularly downward (that is, even if the structure shown in the figure is turned upside down), the first semiconductor chip 206 will not end up separating from the first anisotropic conductive film 208 due to gravity.

Due to this preliminary press bonding, the stud bumps 207 (projecting electrode terminals) are embedded in the first anisotropic conductive film 208 so that the tips of the stud bumps 207 approach the surfaces of the first semiconductor chip electrode pads 203a, but the tips and the surfaces do not contact each other. They are separated by the first anisotropic conductive film 208 (see area inside broken line circle in figure). Further, at the stage of the preliminary press bonding, the first anisotropic conductive film 208 is still not given conductivity and the stud bumps 207 and the first semiconductor chip electrode pads 203a are not electrically connected.

Figure 5L:
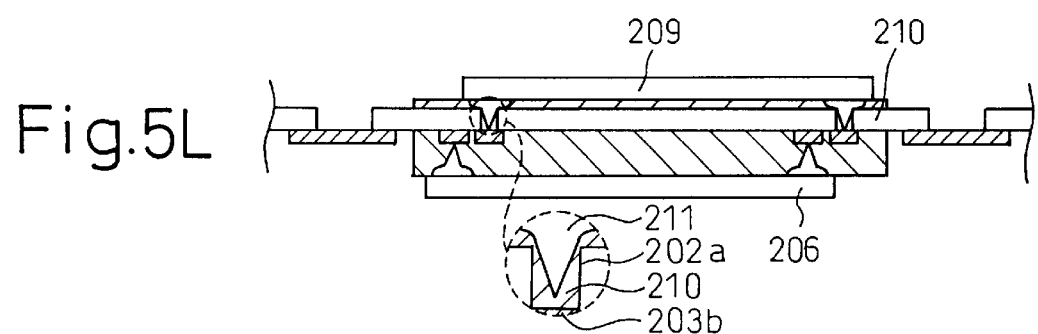

Next, as shown in FIG. 5L, the electrode terminal forming surface of the second semiconductor chip 209 is preliminarily press bonded on the second anisotropic conductive film 210 in a state with the first semiconductor chip 206 made to face perpendicularly downward.

In this preliminary press bonding, the stud bumps 211 (projecting electrode terminals) are inserted into the stud bump through holes 202a through the second anisotropic conductive film 210. As shown inside the broken line circle of that figure, due to this preliminary press bonding, the tips of the stud bumps 211 approach the surfaces of the second semiconductor chip electrode pads 203b. The tips and the surfaces do not however contact each other. They are separated by the second anisotropic conductive film 210.

Further, at the stage of preliminary press bonding, the second anisotropic conductive film 210 is still not given conductivity and the stud bumps 207 and the second semiconductor chip electrode pads 203b are not electrically connected.

Figure 5M:
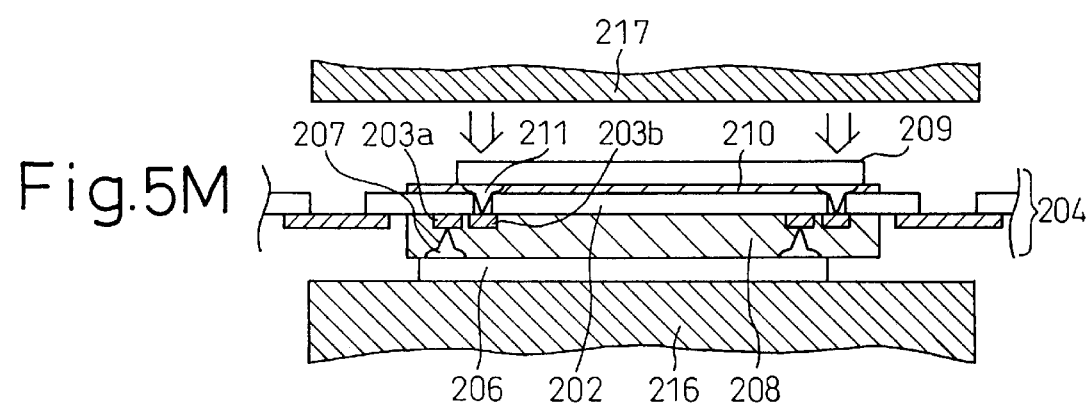

Next, when the preliminary press bonding is finished, the main press bonding step shown in FIG. 5M is performed. In this main press bonding step, first, the opposite side of the first semiconductor chip 206 from the electrode terminal forming surface is placed on the stage 216. Next, the opposite surface of the second semiconductor chip 209 from the electrode terminal forming surface is pressed by a tool 217 in a state with the first anisotropic conductive film 208 and the second anisotropic conductive film 210 heated. By doing this, even the opposite side of the first semiconductor chip 206 from the electrode terminal forming surface is pressed by the stage 216.

If the first semiconductor chip 206 and the second semiconductor chip 209 are pressed in this way, the first anisotropic conductive film 208 and the second anisotropic conductive film 210 sandwiched between these semiconductor chips and polyimide film 202 are pressed while heated.

If heated and pressed in this way, the portions of the first anisotropic conductive film 208 between the tips of the stud bumps 207 and the first semiconductor chip electrode pads 203a (see inside of broken line circle in FIG. 5K) are given conductivity in the thickness direction. Similarly, the second anisotropic conductive film 210 as well is given conductivity in the thickness direction at the portions between the tips of the stud bumps 211 and the second semiconductor chip electrode pads 203b (see inside of broken line circle in FIG. 5L).

Due to this, the stud bumps 207 and the stud bumps 211 are electrically connected to the first semiconductor chip electrode pads 203a and the second semiconductor chip electrode pads 203.

Further, due to the heat and pressure, the first anisotropic conductive film 208 and the second anisotropic conductive film 210 are cured. The first semiconductor chip 206 and the second semiconductor chip 209 are bonded to the interconnection substrate 204 by a sufficient bonding force through these anisotropic conductive films.

In this way, in the main press bonding step, it is possible to simultaneously mount two semiconductor chips (206 and 209) on the interconnection substrate 204. Therefore, it is possible to reduce the number of steps compared with the conventional example where the two semiconductor chips were separately mounted and possible to reduce the manufacturing cost of the semiconductor device 201.

Figure 5N:
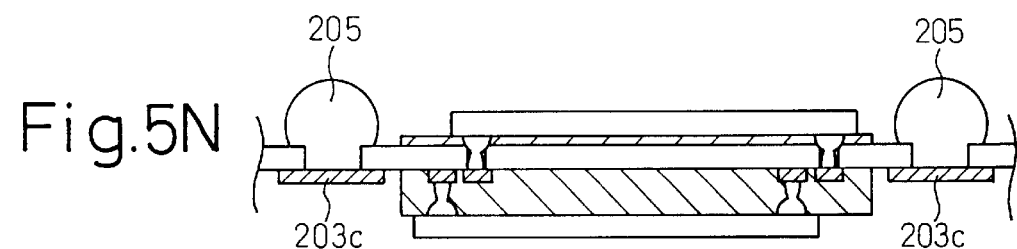

When this main press bonding step is finished, the step shown in FIG. 5N is performed. In this step, solder bumps 205 are placed on the solder bump pads 203c.

Figure 6A:
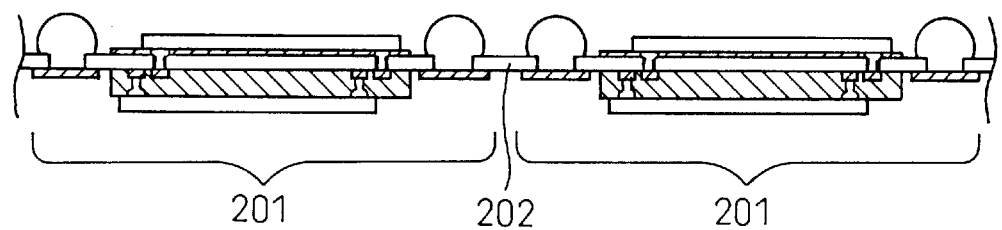
FIGS. 6A and 6B are sectional views of steps after FIG. 5N in the method of production of a semiconductor device of the present invention.
Figure 7:
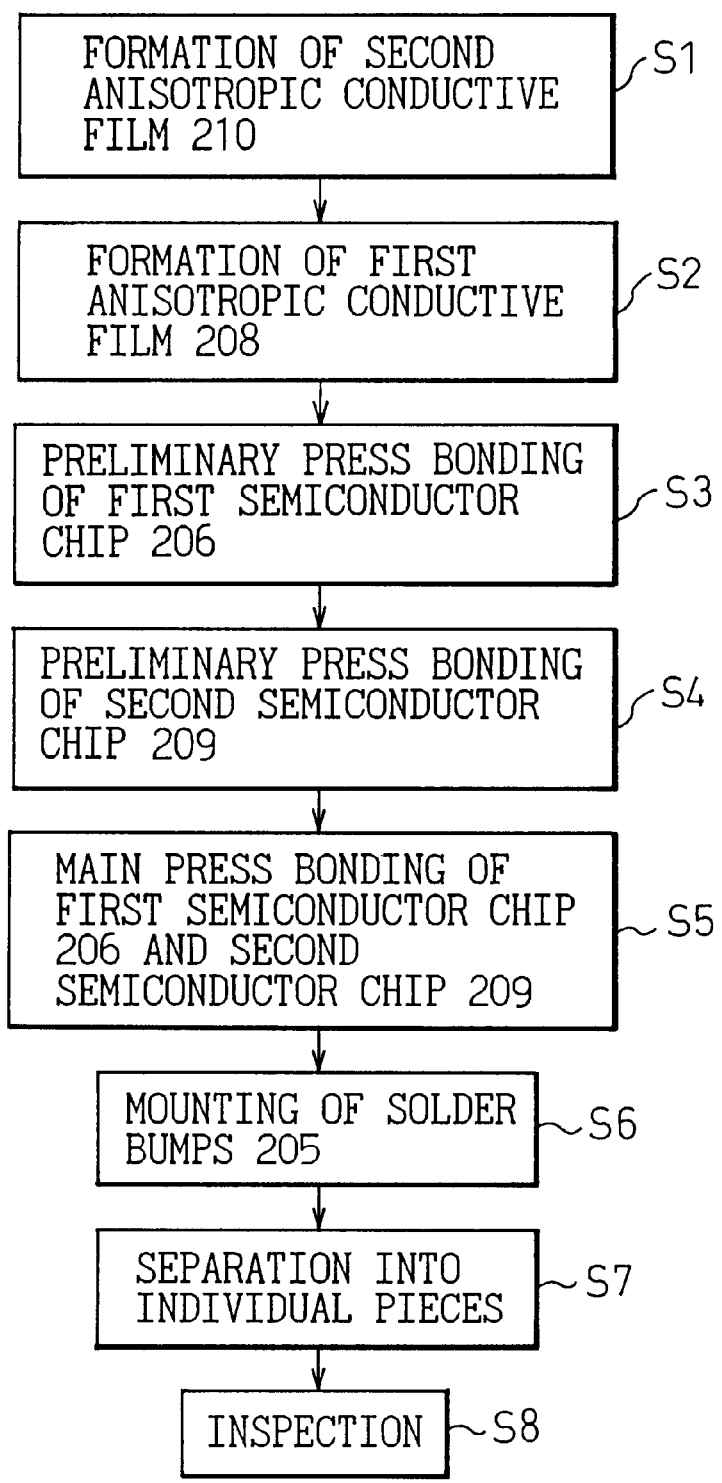
FIG. 7 is a flow chart of important points in the method of production of a semiconductor device of the present invention.

In the above figures, the portion corresponding to a single semiconductor device 201 is shown enlarged, but in practice, as shown in FIG. 6A, a plurality of semiconductor devices 201 are formed on a long polyimide film 202.

Figure 6B:
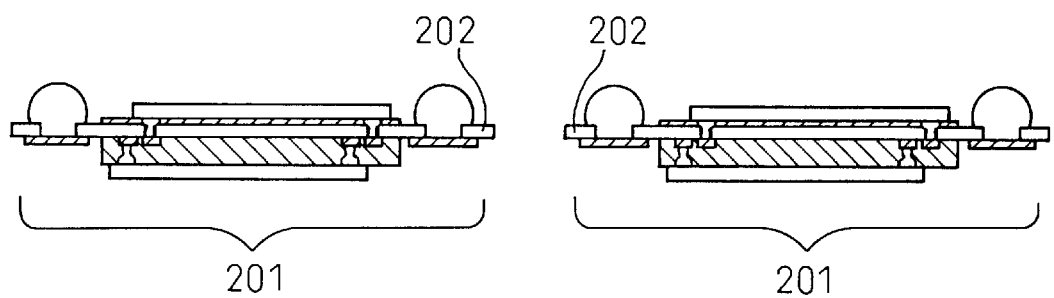

Next, as shown in FIG. 6B, the polyimide film 202 is cut to separate the plurality of semiconductor devices 210 into individual pieces.

Finally, each of the individual pieces of the semiconductor devices 201 is inspected to determine if it satisfies predetermined specifications for electrical characteristics.

Due to this, the semiconductor device 201 according to this embodiment is completed. The main points of the above production process may be summarized as in FIG. 7.

As shown in FIG. 7, the production process of the upper semiconductor device 201 is comprised of the following eight steps:

Step S1: Formation of second anisotropic conductive film 210 (step of FIG. 5I)

Step S2: Formation of first anisotropic conductive film 208 (step of FIG. 5J)

Step S3: Preliminary press bonding of first semiconductor chip 206 (step of FIG. 5K)

Step S4: Preliminary press bonding of second semiconductor chip 206 (step of FIG. 5L)

Step S5: Main press bonding of first semiconductor chip 206 and second semiconductor chip 209 (step of FIG. 5M)

Step S6: Mounting of solder bumps 205 (step of FIG. 5N)

Step S7: Separation into individual pieces (step of FIG. 6A)

Step S8: Inspection

In the method of production of a semiconductor device of the related art, as explained with reference to FIG. 10, a total of 12 steps were required until completion of the semiconductor device 101. As opposed to this, with the method of production of a semiconductor device according to this embodiment, the semiconductor device 201 can be completed in eight steps—less than the related art. In particular, in step S5 (main press bonding step), a single step is enough for main press bonding of two semiconductor chips (206, 209), so the number of steps can be greatly reduced. Due to this, with the method of production of a semiconductor device according to the present embodiment, it is possible to produce a semiconductor device 201 at a lower manufacturing cost than the past.

Summarizing the effects of the invention, according to the semiconductor device of the present invention, since only one interconnection substrate comprised by the plastic film and interconnection pattern is provided in the thickness direction, compared with the conventional example where two interconnection substrates are provided in the thickness direction of the semiconductor device, the thickness can be made smaller.

Further, since the semiconductor device has the first semiconductor chip and the second semiconductor chip provided at both surfaces of the plastic film, the stresses occurring at the two surfaces of the plastic film are canceled out and warping of the interconnection substrate can be suppressed. Due to this, separation of the electrode terminals of the semiconductor chips from the anisotropic conductive films as in the past is eliminated, so the reliability of electrical connection between the semiconductor chips and the interconnection substrate is improved.

Further, if the first semiconductor chip and the second semiconductor chip are arranged shifted from each other so as not to completely overlap, the portions of the interconnection pattern electrically connected with the first semiconductor chip and the portions electrically connected with the second semiconductor chip can be arranged separated from each other so short-circuits of these portions can be prevented.

Further, when the first semiconductor chip and the second semiconductor chip are arranged shifted from each other in this way, by affixing a stress-cancellation plate on one surface of the plastic film in a region where the first semiconductor chip and second semiconductor chip do not overlap, warping of the interconnection substrate in that region is suppressed.

Further, if a first semiconductor chip and a second semiconductor chip having the same functions and same electrode terminal array are used, the design of the interconnection pattern can be simplified.

Further, by affixing a reinforcement plate to the edge region of one surface of the plastic film, the strength of the semiconductor device can be raised.

Further, according to the method of production of the semiconductor device according to the present invention, the first semiconductor chip and the second semiconductor chip are electrically connected simultaneously to the interconnection pattern in the main press bonding step, so the number of steps of the process of production of the semiconductor device is reduced and the manufacturing cost of the semiconductor device can be lowered.

While the invention has been described with reference to specific embodiments chosen for purpose of illustration, it should be apparent that numerous modifications could be made thereto by those skilled in the art without departing from the basic concept and scope of the invention.

The present disclosure relates to subject matter contained in Japanese patent application No. 2000-310689, filed on Oct. 11, 2000, the disclosure of which is expressly incorporated herein by reference in its entirety.

What is claimed is:

1. A semiconductor device comprising:

an insulating plastic film formed with through holes;

an interconnection pattern formed on one surface of said plastic film and covering openings of said through holes at least at said one surface;

a first semiconductor chip flip-chip bonded on said interconnection pattern so as to be electrically connected with said interconnection pattern;

a second semiconductor chip flip-chip bonded on the other surface of said plastic film so as to be electrically connected with said interconnection pattern through said through holes; and external connection terminals electrically connected with said interconnection pattern.

2. A semiconductor device as set forth in claim 1, wherein said first semiconductor chip and said second semiconductor chip are arranged shifted from each other so that they do not completely overlap.

3. A semiconductor device as set forth in claim 2, wherein a stress-cancellation plate is fixed at the region where the first semiconductor chip and the second semiconductor chip do not overlap on either surface of said plastic film.

4. A semiconductor device as set forth in any one of claims 1 to 3, wherein a first semiconductor chip and second semiconductor chip having the same functions and same electrode terminal array are used.

5. A semiconductor device as set forth in any one of claims 1 to 3, wherein a reinforcement plate is affixed to an edge region of one of the surfaces of said plastic film.

6. A semiconductor device as set forth in claim 4, wherein a reinforcement plate is affixed to an edge region of one of the surfaces of said plastic film.

* * * * *